United States Patent [19]

Papaieck

[11] Patent Number: 4,725,786
[45] Date of Patent: Feb. 16, 1988

[54] FULL-OCTAVE DIRECT FREQUENCY SYNTHESIZER

[75] Inventor: Robert J. Papaieck, Fort Salonga, N.Y.

[73] Assignee: Comstron Corporation, Freeport, N.Y.

[21] Appl. No.: 634,744

[22] Filed: Jul. 26, 1984

[51] Int. Cl.⁴ .................. H03B 19/00; H03L 7/00
[52] U.S. Cl. ............................. 328/14; 307/271; 331/40
[58] Field of Search .......... 328/14, 15, 38.1, 140, 328/156; 331/39, 40, 42; 307/219.1, 271, 529

[56] References Cited

U.S. PATENT DOCUMENTS

| | | | |
|---|---|---|---|
| 3,188,578 | 6/1965 | Winsor, III | 331/39 |
| 3,372,347 | 3/1968 | Jones et al. | 331/39 |
| 3,454,883 | 7/1969 | Oropeiza | 328/14 |
| 3,838,355 | 9/1974 | Papaieck | 328/14 |
| 3,906,388 | 9/1975 | Jones et al. | 331/39 |
| 4,425,552 | 1/1984 | Stirling | 331/39 |
| 4,516,085 | 5/1985 | Effinger et al. | 331/40 |

Primary Examiner—Stanley D. Miller
Assistant Examiner—Timothy P. Callahan
Attorney, Agent, or Firm—Gottlieb, Rackman & Reisman

[57] ABSTRACT

A full-octave direct frequency synthesizer which can switch in under one microsecond and whose control frequencies are all harmonics of a single precision clock. Each stage generates a frequency in the 50–100 MHz range; the generated frequency is the sum of one-tenth of the input frequency plus an added increment within the full octave 50–100 MHz range. Each stage includes a first section for operating on the input frequency and the control frequencies for deriving a selected one of five possible frequencies, and a second section for deriving two possible frequencies from each of the five derivable by the first section. The final stage generates a frequency in the 500–1,000 MHz range, in steps of 0.5 Hz.

4 Claims, 9 Drawing Figures

| DIGIT | FREQUENCY INPUT | FREQUENCY OUTPUT | SWITCHES | | | | | | |
|---|---|---|---|---|---|---|---|---|---|
| | | | 1 | 2 | 3 | 4 | 5 | 6 | 7 |
| 0 | 50.0-99.99" | 50-54.999... | 1 | 0 | 0 | 1 | 0 | 1 | 0 |
| 1 | " | 55-59.999... | 0 | 1 | 0 | 1 | 0 | 1 | 0 |
| 2 | " | 60-64.999... | 0 | 0 | 1 | 0 | 0 | 1 | 0 |
| 3 | " | 65-69.999... | 0 | 1 | 0 | 0 | 1 | 1 | 0 |
| 4 | " | 70-74.999... | 1 | 0 | 0 | 0 | 1 | 1 | 0 |
| 5 | " | 75-79.999... | 1 | 0 | 0 | 1 | 0 | 0 | 1 |
| 6 | " | 80-84.999... | 0 | 1 | 0 | 1 | 0 | 0 | 1 |
| 7 | " | 85-89.999... | 0 | 0 | 1 | 0 | 0 | 0 | 1 |
| 8 | " | 90-94.999... | 0 | 1 | 0 | 0 | 1 | 0 | 1 |
| 9 | " | 95-99.999... | 1 | 0 | 0 | 0 | 1 | 0 | 1 |

*FIG. 2A*

| DIGIT | FREQUENCY INPUT | FREQUENCY OUTPUT | SWITCHES | | | | | | |
|---|---|---|---|---|---|---|---|---|---|
| | | | 1 | 2 | 3 | 4 | 5 | 6 | 7 |
| 0 | 50.0-99.999" | 50-54.999... | 1 | 0 | 0 | 0 | 0 | 1 | 0 |
| 1 | " | 55-59.999... | 0 | 1 | 0 | 0 | 0 | 1 | 0 |
| 2 | " | 60-64.999... | 0 | 0 | 1 | 0 | 0 | 1 | 0 |
| 3 | " | 65-69.999... | 0 | 0 | 0 | 1 | 0 | 1 | 0 |
| 4 | " | 70-74.999... | 0 | 0 | 0 | 0 | 1 | 1 | 0 |
| 5 | " | 75-79.999... | 1 | 0 | 0 | 0 | 0 | 0 | 1 |
| 6 | " | 80-84.999... | 0 | 1 | 0 | 0 | 0 | 0 | 1 |
| 7 | " | 85-89.999... | 0 | 0 | 1 | 0 | 0 | 0 | 1 |
| 8 | " | 90-94.999... | 0 | 0 | 0 | 1 | 0 | 0 | 1 |
| 9 | " | 95-99.999... | 0 | 0 | 0 | 0 | 1 | 0 | 1 |

*FIG. 3A*

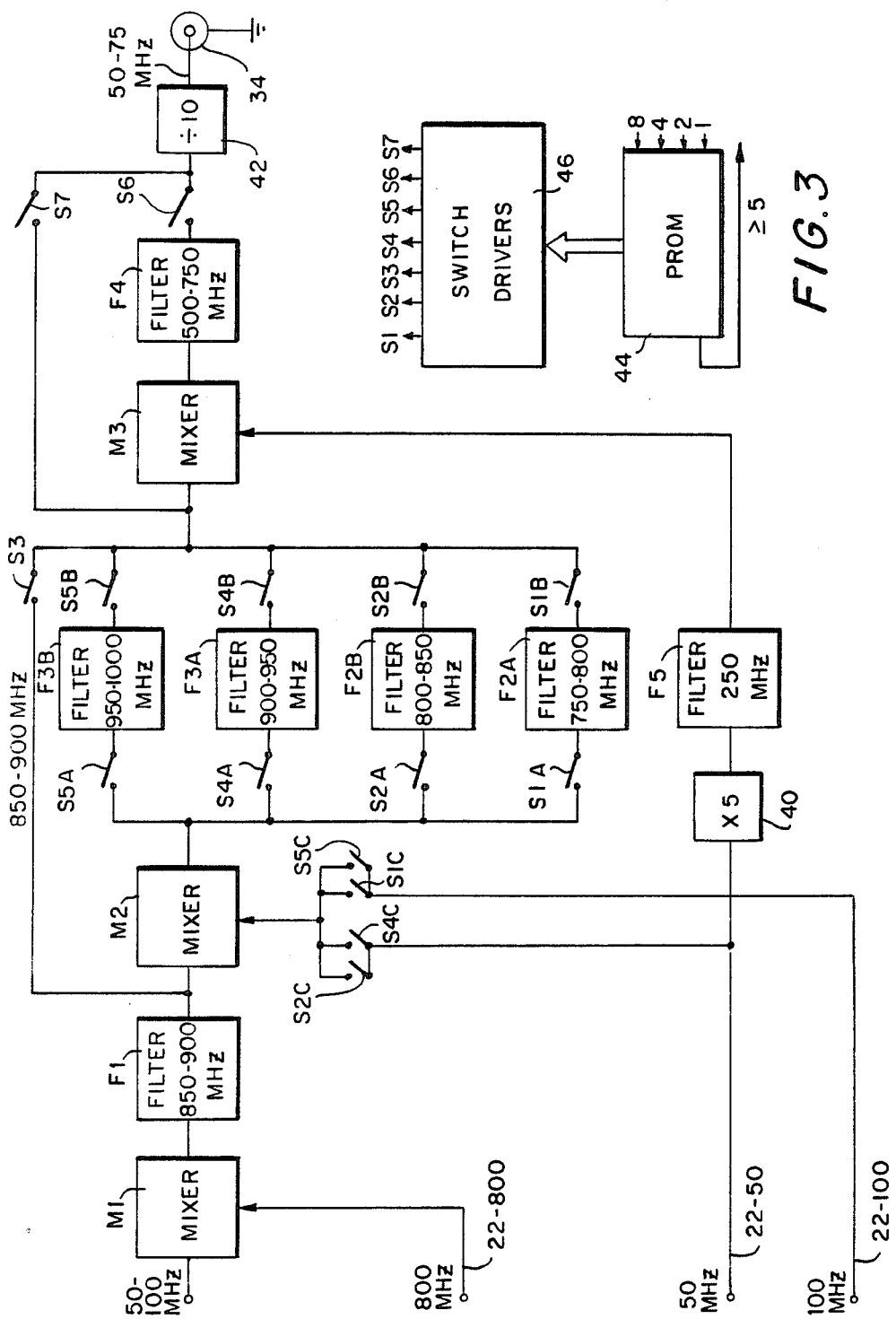

FIG. 4A

| 100-MHz DIGIT | 10-MHz DIGIT | FREQUENCY INPUT | FREQUENCY OUTPUT | \multicolumn{13}{c}{SWITCHES} |||||||||||||
|---|---|---|---|---|---|---|---|---|---|---|---|---|---|---|---|---|
| | | | | 1 | 2 | 3 | 4 | 5 | 6 | 7 | 8 | 9 | 10 | 11 | 12 | 13 |
| 0 | 0 – 4 | 50 – 74.999 | 500 – 524.999 | 1 | 0 | 1 | 0 | 0 | 1 | 0 | 0 | 0 | 0 | 0 | 0 | 0 |
| | 5 – 9 | 75 – 99.999 | 525 – 549.999 | 0 | 1 | 0 | 1 | 0 | 1 | 0 | 0 | 0 | 0 | 0 | 0 | 0 |
| 1 | 0 – 4 | 50 – 74.999 | 550 – 574.999 | 1 | 0 | 0 | 0 | 1 | 0 | 1 | 0 | 0 | 0 | 0 | 0 | 0 |
| | 5 – 9 | 75 – 99.999 | 575 – 599.999 | 0 | 1 | 0 | 0 | 1 | 0 | 1 | 0 | 0 | 0 | 0 | 0 | 0 |
| 2 | 0 – 4 | 50 – 74.999 | 600 – 624.999 | 1 | 0 | 1 | 0 | 0 | 0 | 0 | 1 | 0 | 0 | 0 | 0 | 0 |
| | 5 – 9 | 75 – 99.999 | 625 – 649.999 | 0 | 1 | 0 | 0 | 0 | 0 | 0 | 1 | 0 | 0 | 0 | 0 | 0 |
| 3 | 0 – 4 | 50 – 74.999 | 650 – 674.999 | 1 | 0 | 0 | 0 | 1 | 0 | 0 | 0 | 1 | 0 | 0 | 0 | 0 |
| | 5 – 9 | 75 – 99.999 | 675 – 699.999 | 0 | 1 | 0 | 0 | 1 | 0 | 0 | 0 | 1 | 0 | 0 | 0 | 0 |
| 4 | 0 – 4 | 50 – 74.999 | 700 – 724.999 | 1 | 0 | 1 | 0 | 0 | 1 | 0 | 0 | 0 | 0 | 1 | 0 | 0 |
| | 5 – 9 | 75 – 99.999 | 725 – 749.999 | 0 | 1 | 0 | 1 | 0 | 1 | 0 | 0 | 0 | 0 | 1 | 0 | 0 |
| 5 | 0 – 4 | 50 – 74.999 | 750 – 774.999 | 1 | 0 | 0 | 0 | 1 | 0 | 1 | 0 | 0 | 0 | 0 | 1 | 0 |
| | 5 – 9 | 75 – 99.999 | 775 – 799.999 | 0 | 1 | 0 | 0 | 1 | 0 | 1 | 0 | 0 | 0 | 0 | 1 | 0 |
| 6 | 0 – 4 | 50 – 74.999 | 800 – 824.999 | 1 | 0 | 1 | 0 | 0 | 0 | 0 | 1 | 0 | 0 | 0 | 0 | 1 |
| | 5 – 9 | 75 – 99.999 | 825 – 849.999 | 0 | 1 | 0 | 0 | 0 | 0 | 0 | 1 | 0 | 0 | 0 | 0 | 1 |
| 7 | 0 – 4 | 50 – 74.999 | 850 – 874.999 | 1 | 0 | 0 | 0 | 1 | 0 | 0 | 0 | 0 | 0 | 0 | 0 | 1 |
| | 5 – 9 | 75 – 99.999 | 875 – 899.999 | 0 | 1 | 0 | 0 | 1 | 0 | 0 | 0 | 0 | 0 | 0 | 0 | 1 |
| 8 | 0 – 4 | 50 – 74.999 | 900 – 924.999 | 1 | 0 | 1 | 0 | 0 | 0 | 0 | 0 | 0 | 0 | 0 | 0 | 1 |
| | 5 – 9 | 75 – 99.999 | 925 – 949.999 | 0 | 1 | 0 | 0 | 0 | 0 | 0 | 0 | 0 | 0 | 0 | 0 | 1 |
| 9 | 0 – 4 | 50 – 74.999 | 950 – 974.999 | 1 | 0 | 0 | 0 | 1 | 0 | 0 | 0 | 1 | 0 | 0 | 0 | 1 |
| | 5 – 9 | 75 – 99.999 | 975 – 999.999 | 0 | 1 | 0 | 0 | 1 | 0 | 0 | 0 | 1 | 0 | 0 | 0 | 1 |

100-MHz DECADE

FULL-OCTAVE DIRECT FREQUENCY SYNTHESIZER

DESCRIPTION

This invention relates to frequency synthesizers, and more particularly to a frequency synthesizer which is fast switching, covers a full octave, and utilizes only harmonics of a single clock frequency.

In the last twenty-five years, there have been numerous advances in the art of frequency synthesis. There are two kinds of frequency synthesizers—direct and indirect. The majority of synthesizers are of the indirect type, employing one or more phase lock loops, with each loop including a voltage controlled oscillator, a variable divider, and a phase detector. Even the fastest indirect synthesizers have switching speeds measured in milliseconds A switching speed of a millisecond or so is too slow for many communications, radar, automatic test equipment, and military needs.

Synthesizers of the direct type, on the other hand, allow a frequency to be selected by performing arithmetic operations of addition, subtration, multiplication, and division on a signal generated by a frequency standard, often a 10-MHz clock. These synthesizers are capable of switching frequencies in less than 20 microseconds, an improvement of at least an order of magnitude over the switching speeds of indirect synthesizers. Nevertheless, a switching speed of even 20 micronseconds is not fast enough for many present day needs. Also, state-of-the-art direct synthesizers have inadequate spectral purity, thereby limiting the generation of microwave signals by frequency multiplication, and they are costly, large, and complex.

Another problem with prior art direct synthesizers is that they have required filters with narrow passbands. This makes it difficult to cover a full octave without using complex and costly side-stepping techniques. A typical prior art switching range is only 10%, e.g., 500-550 MHz.

Another problem with prior art direct synthesizers is that they use a number of control, or drive, frequencies which are not necessarily harmonically related to a single clock. Almost every direct synthesizer employs a single precision clock, typically 10 MHz. Two or more control frequencies are derived from this clock and extended to each of many stages in the synthesizer. The cost of a direct synthesizer can be reduced if simple multipliers can be used to derive the control frequencies, that is, if the control frequencies include only the clock itself and harmonics (frequencies which are integral multiples of the clock frequency).

It is a general object of my invention to provide a direct frequency synthesizer which is fast switching (under one microsecond), covers a full octave (e.g., 500-1,000 MHz), and uses only drive frequencies which are harmonics of a clock (e.g., a clock of 10 MHz, the first harmonic, and drive frequencies of 50, 100 and 800 MHz). Preferably, only three drive frequencies are required.

As in the prior art, I use a plurality of decade stages, many of which are identical. The last three decades in the chain are slightly different from the others, and are more complex for reasons which will become apparent. As in some prior art systems, each decade provides ten frequency steps. Three decades, for example, provide 1,000 frequency steps. To cover the range 500-1,000 MHz in 0.5-Hz steps requires 9 decades (1,000 MHz = $10^9$). Each stage includes a first section for operating on an input frequency and the control frequencies for deriving one of five possible frequencies, and a second section for deriving two possible frequencies from each of the five derivable by the first section. Each stage, except the first and last, operates on an input frequency from a preceding stage and generates an output frequency which is the sum of one-tenth of the input frequency plus an added increment within an octave range. (The last stage has no divider). This means that, in the case of a nine-stage synthesizer, the contribution of the first stage (in 5-MHz steps) is divided down so that it affects the resolution by 0.5 Hz at the final output. Similarly, the contribution of the second stage, also having a resolution of 5 MHz, is reflected in the output as a resolution of 5 Hz. This arrangement of decades is in itself not new. What is new is the design of each decade.

Further objects, features, and advantages of my invention will become apparent upon consideration of the following detailed description in conjunction with the drawing, in which:

FIG. 3 depicts a stage which can be used for the seventh decade of the system of FIG. 1, with FIG. 3A being a chart indicating when each of the switches in the stage is closed;

The following patents illustrate typical prior art direct frequency synthesizers:

| Patent Number | Inventor | Date |
|---|---|---|
| 2,829,255 | V. W. Bolie | 4/01/58 |
| 2,930,988 | A. F. Boff | 3/29/60 |
| 2,934,716 | J. W. Smith | 4/26/60 |
| 3,125,729 | R. R. Stone, Jr. et al | 3/17/64 |
| 3,235,815 | R. J. Keicher | 2/15/66 |
| 3,331,035 | G. E. Strickholm | 7/11/67 |
| 3,372,347 | E. D. Jones et al | 3/05/68 |
| 3,454,883 | F. C. Oropeza et al | 7/08/69 |
| 3,838,355 | R. J. Papaieck | 9/24/74 |
| 3,906,388 | J. P. Jones et al | 9/16/75 |
| 3,277,361 | R. R. Stone, Jr. | 10/4/66 |

This group of patents teaches the basic idea of using decade stages and drive frequencies, with the contribution of each stage being divided down in successive stages. A typical stage uses a mixer for adding (or subtracting) an input and the drive frequencies, together with a division circuit near the output. None of these patents, however, employs the drive frequencies of the system of FIG. 1, or allows both switching speeds of under one microsecond and a full octave range.

Figure 1:
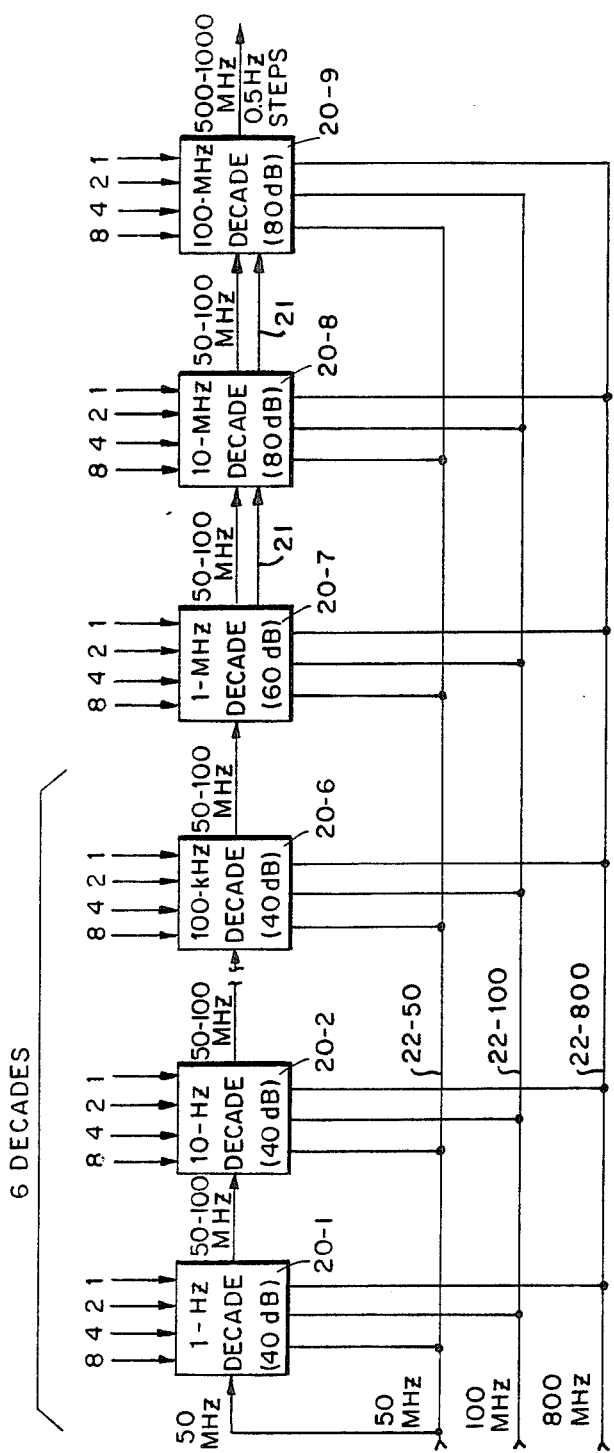
FIG. 1 is a block diagram of the illustrative embodiment of my invention.

The synthesizer of FIG. 1 has nine stages 20-1 through 20-9. The input to each stage is in the 50-100

MHz range. The output of each stage is similarly in the 50-100 MHz range, except for the last stage whose output covers the octave 500-1,000 MHz. With nine stages, steps of 0.5 Hz can be provided in the 500-1,000 MHz output range; if the range is doubled to 1,000-2,000 MHz (by providing a frequency doubler at the output), steps of 1 Hz define the resolution.

There are three drive frequencies extended to each stage—50 MHz, 100 MHz, and 800 MHz. The 50-MHz drive signal serves as the input to the first decade 20-1. Each of the succeeding eight decades has as its input the output of the preceding stage. (Each of the last two stages also requires a control input 21 from the preceding stage.) The stages are identified as 1-Hz, 10-Hz, etc. These designations refer to the doubled range 1,000-2,000 MHz should an output doubler be added. The first stage is provided with a BCD input code which designates one of ten output frequencies, in 5-MHz steps. The five possible outputs of the first decade are 50 MHz, 55 MHz, . . . 95 MHz. Each stage, except for the last, contains a divide-by-ten circuit in the input-output path. This means that a frequency change at the input is reflected in a frequency change of only one-tenth that value at the output. Thus any change made in the output of the first stage is reflected as a 0.5-MHz change at the output of the second stage.

Suppose, for example, that the second stage has its BCD input set to the digit 6. This corresponds to a frequency in the range 80-84.5 MHz. (The digit 6 provides an output frequency of 80 MHz, but each stage adds to the frequency which it controls one-tenth of the input frequency minus 50 MHz.) Depending on the output of the first stage, which can be any of the values 50, 55 . . . 95 MHz, the output of the second stage will be 80.0, 80.5, 81.0, 81.5, . . . 84.5 MHz. If the second stage is set to provide a 55 MHz signal, then depending on the output of the first stage, the output of the second stage will be 55.0, 55.5, 56.0, . . . 59.5 MHz. As a last example, if the second stage is set to provide a 95-MHz output, the actual output, depending on the setting of the first stage, will be 95.0, 95.5, 96.0, . . . 99.5 MHz. It is thus seen that the output of the first stage, with 50 MHz substracted from it, is reflected in the output of the second stage after being divided by 10.

In a similar way, the output of the third stage has a component 50, 55, . . . 95 MHz which depends on the BCD input to the third stage. The actual output of the third stage is in the range 50.00-99.95 MHz. The tenth and hundredth digits are determined by subtracting 50 MHz from the output of the second stage, and then dividing by 10.

This kind of arrangement of stages is not new in and of itself. With nine stages, the output of the last, assuming that the divide-by-ten circuit is omitted, is in the 500-1,000 MHz range, with stage 20-1 determining a 0.5-Hz step, stage 20-2 determining a 5.0-Hz step, etc. Assuming that the output is doubled, the output varies between 1,000,000,000 Hz and 1,999,999,999 Hz; the first stage determines the least significant digit, the second stage determines the second least significant digit, etc. This is what is meant in FIG. 1 by referring to the first stage as the "1-Hz decade," the second stage as the "10-Hz decade," etc.

Each stage except the last provides a signal which is ten times greater in frequency than desired at the output. The divide-by-ten circuit which is included in the stage divides the frequency down to the 50-100 MHz range. That same divider divides the input frequency by 10. It is in this way that successive stages cause earlier stages to affect lower significant digits. Each decade operates on an input signal in the 50-100 MHz range, and on three drive frequencies, the highest of which is 800 MHz. The reason for operating at these relatively "low" frequencies is that divide-by-ten circuits are readily available for frequencies under about 1,300 MHz. Also, by operating at frequencies below 1,000 MHz, the filters required in each stage can be made much smaller and they are less costly. This is the reason that in the illustrative embodiment of the invention each stage operates in the 50-100 MHz range with the highest control frequency being 800 MHz. With the divide-by-ten circuit omitted in the last stage, the output frequency is in the 500-1,000 MHz range, and a doubler is required to provide the desired 1,000-2,000 MHz range. The doubler can be omitted, with the same final range being obtained, as the technology progresses and the individual stages can handle higher frequencies without additional expense. (One advantage of using higher frequencies is that it is easier to eliminate undesired harmonics. Also, the doubler at the output necessarily increases the noise level and spurious signals. It is well known to those skilled in the art that it is desirable to reduce the number of multipliers in the system. Still another reason for using higher frequencies is that fast switching requires wide bandwidths, and the higher the frequencies the wider the bandwidth.)

It will be noted that each of the first six stages in FIG. 1 is labeled "40 dB," the seventh stage is labeled "60 dB," and the last two stages are labeled "80 dB." In general, when a frequency is multiplied by a factor M, the noise and spurious signals which are introduced degrade the spectral purity by 20 log (M). Conversely, when dividing by M, the spectral purity and noise level are improved by 20 log (M). (The term "noise" refers to random signals, while the term "spurious" refers to defined frequencies which result from mixing operations.) Suppose that the system is to provide 80 dBc at the output. This means that the ratio of amplitudes of the carrier frequency to the combined noise and spurious signals is 80 dB. Each stage includes mixers, as will be signals of the form $n(f1)+m(f2)$, where f1 and f2 are the input frequencies, and m and n are positive or negative integers. Ideally, n and m are 1 or −1 so that sum and difference signals can be obtained. The spurious signals result from values of n and m which are integers other than 1 or −1. One advantage of the individual stages of my invention is that the spurious frequencies are very far away from the desired frequencies so that they are greatly attenuated by the filters. Nevertheless, to achieve 80-dBc performance requires expensive shielding, and the use of narrow filters. The techniques for achieving 80-dB performance are well known in the art, but they increase the cost of any system. Each stage, except the last, in the system of FIG. 1 has a divide-by-ten circuit at its output. This circuit decreases the noise level of the input by 20 dB. The last stage has no divider and thus to achieve 80-dB performance it is necessary that the stage itself be designed at this performance level. Similarly, the next-to-last stage must provide the same performance because the last stage does not improve on it. But because the next-to-last stage improves the performance by 20 dB with respect to an incoming signal, stage 20-7 only has to provide 60-dB performance. The earlier stages in the sequence do not even have to be this good, although 40-dB performance is so easy to achieve today that it is more efficient to standardize the least significant stages of the system. Thus three different stage designs are employed, with the 40-dB stages requiring almost no shielding and relatively few filters.

Before actually describing the individual stages, another desirable characteristic of a synthesizer should be mentioned, that of phase coherence. When switching from one frequency to another, and then back again, there is no guarantee that the phase of the original frequency will be the same as it would have been had there been no intervening switching. It is well known that the loss of phase coherence is due to the use of dividers. One of the advantages of the highest-performance stage of my system is that it allows an overall system to be constructed which does not lose phase coherence. The last stage, 20-9, has no divider. Suppose that three such identical stages are connected in sequence. Without dividers in the stages, the only way that each stage can affect a different digit in the final output is by providing different drive frequencies. Each stage would have three drive frequencies which differ by a factor of ten from the drive frequencies of the preceding stage. In other words, the stages may be identical, but the drive frequencies are different by a factor of ten. The use of three such stages, with nine drive frequencies in all, would give 1,000 frequencies at the output; these frequencies would cover an octave range and there would be no loss in phase coherence when switching back to any frequency.

Figure 2:
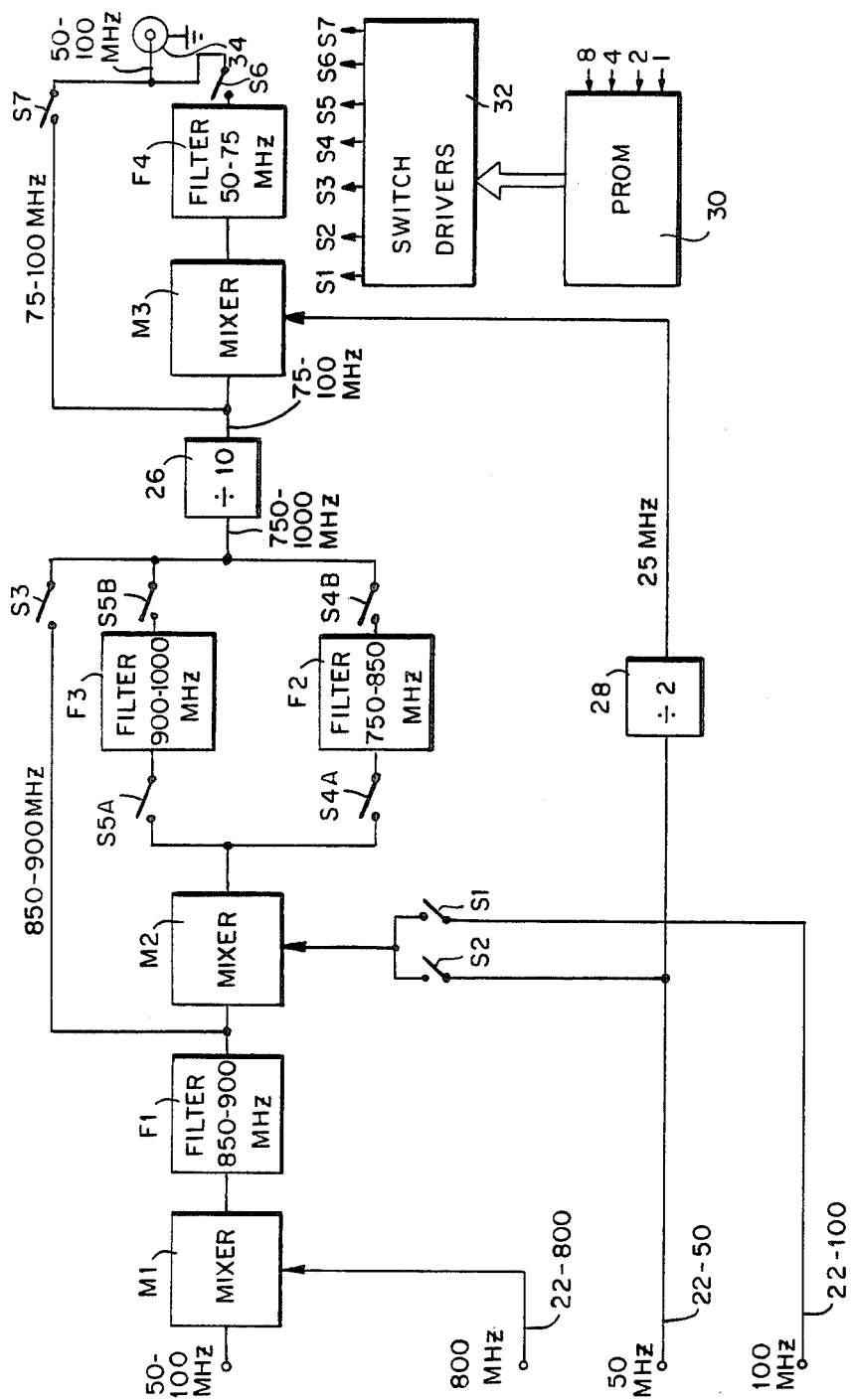
FIG. 2 depicts a stage which can be used for each of the first six decades of the system of FIG. 1, with FIG. 2A being a chart indicating when each of the switches in the stage is closed.

Each of the stages 20-1 through 20-6 in FIG. 1 is connected to the three control lines 22-50, 22-100 and 22-800, the three drive frequencies appearing on these lines. The 50-MHz signal is applied to the input of stage 20-1, but otherwise the output of each stage serves as the input to the next. (The only control connection between stages is via conductors 21, as well as explained below.) An individual stage is shown in FIG. 2. The input signal in the 50-100 MHz range is up-converted in mixer M1. Filter F1 selects the upper sideband, 850-900 MHz. (The mixer adds its input to 800 MHz, and subtracts its input from 800 MHz, as well as generating spurious signals. The filter attenuates all except the upper sideband, the performance of the stage necessarily depending on the shielding and the bandwidth of the filter. A three-section filter with a bandwidth of 50 MHz provides more than 20-dB rejection of the lower sideband.)

Mixer M2 adds to and subtracts from the signal at the output of filter F1 either 50 MHz or 100 MHz. Which of the 50-MHz and 100-MHz control signals is used depends on whether switch S1 or switch S2 is closed. If the 50-MHz signal is used (switch S2 closed), mixer M1 derives signals in two sidebands, 800-850 MHz and 900-950 MHz. Depending upon whether the upper or the lower sideband is desired, either switches S4A, S4B are operated or switches S5A, S5B are operated, so that one of filters F2 or F3 comes into play. (Switches S4A, S4B are parts of the same switch S4; similar remarks apply to all other switches.) Filter F2 is used in order to select the subtracted value and filter F3 is used in order to select the added value. The same thing applies if switch S2 applies a 100-MHz input to mixer M2. Once again, filter F2 is selected if the subtracted value is desired, and filter F3 is selected if the added value is desired. Each filter has a 100-MHz bandwidth; large bandwidth filters may be used because the performance requirements are not as severe as those of the other stages.

The first half of the stage thus allows five different frequencies to be selected. Frequencies in the 850–900 MHz range appear at the output of filter F1, and a frequency in this range is selected if switch S3 is operated. Frequencies in the 750–850 MHz range are derived from filter F2 and are selected by switches S4A, S4B, while frequencies in the 900–1,000 MHz range are derived through filter F3 and selected by switches S5A, S5B.

Suppose, for example, that the input frequency to mixer M1 is 60 MHz. If switch S3 is operated, a frequency of 860 MHz is extended to the input of divide-by-ten circuit 26. Suppose, on the other hand, that switch S3 is not operated and instead switches S5A, S5B are operated. If switch S2 is closed, then 50 MHz is added to and subtracted from the input frequency of 860 MHz to the mixer. The frequencies at the output of the mixer are thus 810 MHz and 910 MHz. With switches S5A, S5B operated, the higher frequency will be selected. Conversely, if switches S4A, S4B are operated instead, the 810 MHz frequency will be selected. Finally, if switch S1 selects the 100 MHz input for mixer M2, then the mixer outputs will be 960 MHz and 760 MHz. Which of the two values is delivered to divide-by-ten circuit 26 depends on which pair of switches S4A, S4B or S5A, S5B are operated.

Each of filters F2 and F3 is preferably a 5-section filter with a bandwidth of 100 MHz, so that a minimum of 20-dB rejection of the undesired sideband can be achieved. The divider 26 further reduces the undesired sideband by an additional 20 dB.

The input to the divider is in the 750–1,000 MHz range, and can be one of five values. The output of the divider is similarly one of five values, but in the 75–100 MHz range. If one of these five frequencies is to be the final value, switch S7 is closed, and the one of five frequencies selected by the first half of the stage is extended to output 34. On the other hand, another five values are possible if switch S6 is closed instead of switch S7. Divide-by-two circuit 28 operates on the 50-MHz input, and thus provides a 25-MHz signal to mixer M3. Since the signal input to the mixer is in the 75–100 MHz range, and filter F4 has a bandwidth of 50–75 MHz, the net result is that another five frequencies are derived each 25 MHz less than a corresponding one of the first five frequencies. Switches S6 and S7 simply determine whether the selected frequency is to be one of the five highest, or one of the five lowest. Whichever switch is selected, the final output is in the 50–100 MHz range.

It should be noted that one of the inputs to down-converter M3 is 25 MHz. The second harmonic of this frequency is 50 MHz, and the third is 75 MHz—both within the 50–100 MHz range of the output. This means that there are two spurious frequencies produced by mixer M3 which fall right within the output range. With a balanced mixer it is possible to obtain a 45–50 dBc level, which is more than adequate performance for the first six stages. This approach is not satisfactory, however, for the last stages where better performance is necessary.

The BCD code which selects the frequency of the stage of FIG. 2 is applied to four inputs of PROM 30. The BCD code serves as an address and the PROM provides a 5-bit code to switch drivers 32. The code simply determines the state of each of switches S1 through S7 (by "switch S4" is meant switches S4A and S4B, with similar remarks applying to switch S5). The actual circuit details for the stage of FIG. 2 will be apparent to those skilled in the art. The construction of mixers, filters, switch drivers, etc. is well known. What is important as far as the present invention is concerned is the arrangement of the blocks, the drive frequencies, the filter passbands, etc.—all of which are depicted in the drawings.

All of the first six stages are identical, except for one difference in the first. The input to the first stage is 50 MHz, while the input to each of the other five stages is the output of the preceding stage. Thus the input of stage 20-2 in FIG. 1 is one of the frequencies 50, 55, . . . 95 MHz, instead of the fixed 50-MHz input frequency of stage 20-1. The total switching time of a stage made in accordance with the design parameters set forth in FIG. 2 can be well under one microsecond.

The table of FIG. 2A depicts each of the ten possible BCD input codes for the stage of FIG. 2. In each case the input frequency is in the range 50.00 . . . —99.99 . . . MHz, but the output frequency is limited to a 5-MHz range for each BCD input code. The states of all switches (0=open, 1=closed) are indicated for each of the ten input codes.

FIG. 3 depicts the 1-MHz, 60-dB decade. The major difference between the stages of FIGS. 2 and 3 is the number of filters required to achieve an additional 20-dB of spurious signal rejection. Mixer M1, filter F1 and mixer M2 in FIG. 3 are the same as the corresponding elements in FIG. 2. However, filters F2 and F3 of FIG. 2, each of which has a bandwidth of 100 MHz, are not employed in FIG. 3. Instead, each of these filters is split into two filters, each having a bandwidth of only 50 MHz. This is done in order to reduce the undesired sidebands to less than —40 dBc. (The divide-by-ten circuit at the output provides the additional 20-dB improvement.) The input BCD code is extended to PROM 44, which controls switch drivers 46. When the S2 output of the switch drivers is energized, for example, three switches are closed—S2A, S2B and S2C.

Referring to the table of FIG. 3A, it should be apparent that switches S1-S5 and filters F2A, F2B, F3A, F3B of FIG. 3 correspond to switches S1-S5 and filters F2, F3 of FIG. 2. The basic difference is that the filters of FIG. 3 have bandwidths of only 50 MHz. This requires four filters instead of two following mixer M2, and four switches instead of two to feed a control frequency to the mixer. The table of FIG. 3A indicates which switches are closed for corresponding desired output frequencies.

In the stage of FIG. 2, after one of five frequencies is derived, the signal is divided by ten, following which 25 MHz may or may not be subtracted from it depending on which of switches S6 or S7 is closed. In the stage of FIG. 3, the subtraction step, if necessary, occurs before the division step. The stage of FIG. 3 is a little more expensive in this respect because the intermediate operation is at higher frequencies. The divide-by-ten circuit is placed at the output in order to achieve improved attenuation of spurious signals since better performance is required of the 60-dB stage.

Multiplier 40 and filter F5 provide a 250-MHz signal, which is subtracted from the selected frequency in mixer M3, whose output is filtered in filter F4. Depending on which of switches S6 or S7 is closed, one of the five frequencies which can be applied to the input of mixer M3 is selected, or that frequency minus 250 MHz is selected. Thereafter, the selected frequency is divided by ten so that a frequency in the 50-100 MHz range is provided at output 34. The overall delay through the decade is similarly under a microsecond.

Figure 4:
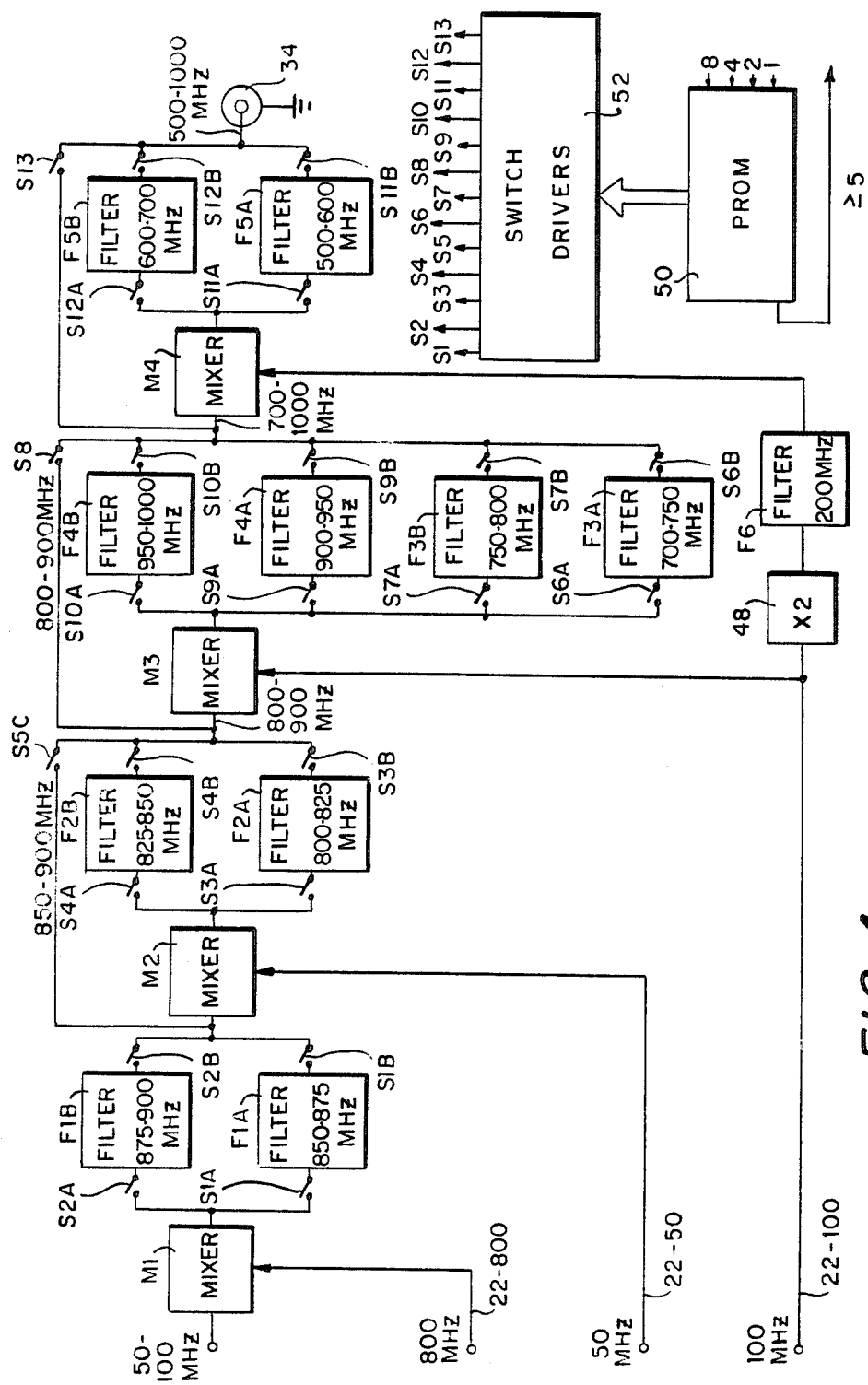
FIG. 4 depicts a stage which can be used for the eighth decade of the system of FIG. 1, with FIG. 4A being a chart indicating when each of the switches in the stage is closed.
Figure 5:
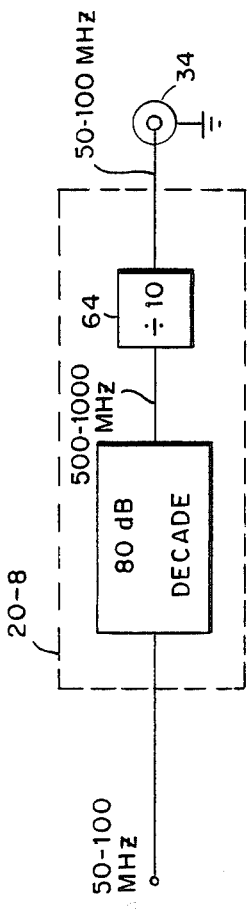
FIG. 5 depicts a stage which can be used for the last decade of the system of FIG. 1.

The last stage is depicted in FIG. 4. As mentioned earlier, it does not include a divide-by-ten circuit at the output so that the output is in the 500-1,000 MHz range. The next-to-last stage does, and it is shown in FIG. 5. Stage 20-8 is nothing more than the stage of FIG. 4 followed by a divider 64. Because the stage of FIG. 4 provides an output in the 500-1,000 MHz range, the output of stage 20-8 (FIG. 5) is in the 50-100 MHz range.

To achieve the higher performance required of the last stage, it will be seen that filter F1 of FIG. 3 (850-900 MHz) is now divided into two filters, each of which has a 25-MHz bandpass. The main reason for using split filters is to ensure that the 800-MHz input to mixer M1 is greatly attenuated and for all intents and purposes is not reflected at the input to mixer M2. The switch S1 and S2 outputs of switch drivers 52 cause either switches S1A, S1B to be closed, or switches S2A, S2B to be closed. Filters F1A, F1B filter the incoming signal which is in the range 50.00 . . . —99.99 . . . MHz. Since each filter has a 25-MHz bandwidth, the only way for the stage of FIG. 4 to "know" which filter should be connected in the circuit is for it to be advised by the preceding stage. It is for this reason that conductors 21 are shown in FIG. 1. Each 60-dB and 80-dB stage includes an output (from the respective PROM) whose level indicates a digit in the 0-4 range, or a digit in the 5-9 range. The next stage thus closes switches S1A, S1B or S2A, S2B depending on whether the output of the preceding stage is in the 50.00 . . . —74.99 . . . MHz range, or the 75.00 . . . —99.99 . . . MHz range. That is why the table of FIG. 4A is the only one which includes two possible input frequency ranges for each of the ten digits applicable to the stage.

Similar remarks apply to filters F2A, F2B and switches S3 and S4 which follow mixer M2. In the stage of FIG. 3, mixer M2 is used to add and substract both the 50 MHz and the 100 MHz signals, and a 4-filter bank provides the requisite filtering. To achieve better performance for the 80-dB decade, it would be required to increase the 4-filter bank to 8 filters, each 25-MHz wide. Instead of doing this, the 50-MHz input is substracted in mixer M2 in FIG. 4, and two 25-MHz wide filters are used. Mixer M3 then has applied to it either the output of filter F2A or the output of filter F2B, or the 850-900 MHz, "bypass" signal controlled by switch S5. The overall signal is in the 800-900 MHz range, and mixer M3 adds and subtracts 100 MHz. The lower sideband, or subtracted frequency, is selected by 50-MHz wide filters F3A and F3B. The upper sideband, or added frequency, is selected by filters F4A and F4B. This part of the stage also includes a bypass range, 800-900 MHz, selected by switch S8, and the output is in five ranges, 700-750, 750-800, 800-900, 900-950, and 950-1,000 MHz. It should be noted that an extra range has been added in the decade of FIG. 4, 700-750 MHz. This is because it was found difficult to use a 250-MHz signal to down-convert the 750-1,000 MHZ range into a 500-750 MHz range. What is done instead is to down-convert the 700-900 MHz range to 500-700 MHz using a 200-MHz signal derived by multiplier 48 and filter F6.

The lower sideband outputs of mixer M4 are selected by 100-MHz wide filters F5A and F5B, which suppress 700-1,000 MHz signals. When switch S13 is closed, the 700-1,000 MHz range is outputted from the decade (see table of FIG. 4A). When either of switches S11 or S12 is closed, switch S13 is open and the down-converted 500–700 MHz range is outputted. The total delay through the stage of FIG. 4 is under 1 microsecond, as with the other stages. In fact, the switching speeds of all stages are so fast that it takes less than one microsecond to change the overall frequency of the system of FIG. 1.

Figure 6:
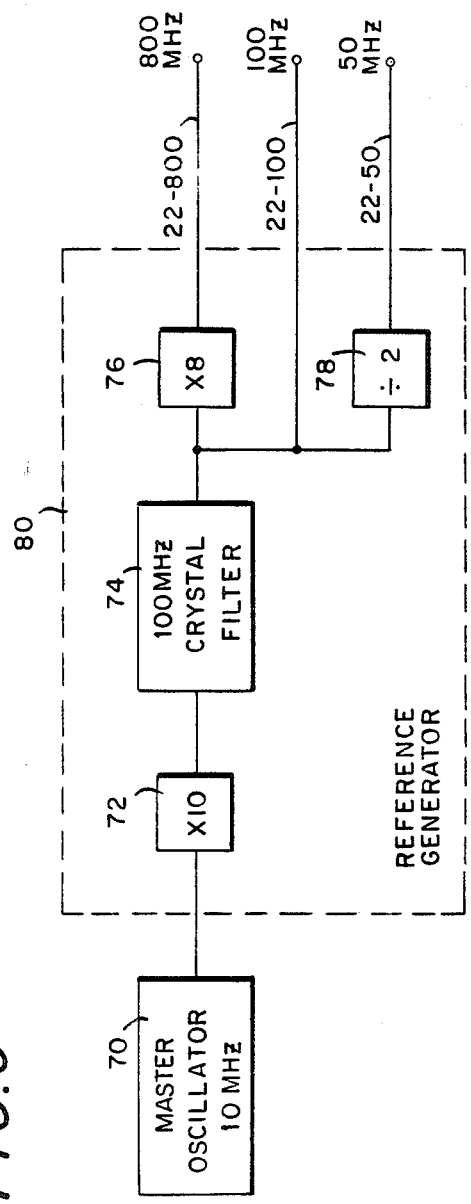
FIG. 6 depicts the manner in which the system drive frequencies can be derived as simple harmonics of a precision clock.

FIG. 6 depicts the manner in which the drive frequencies can be derived. Reference generator 80 derives the three drive frequencies from a 10-MHz master oscillator 70. The 10-MHz clock is first multiplied by 10 in multiplier 72, and the output of crystal filter 74 is thus 100 MHz. The output of the filter is applied directly to line 22-100. Multiplier 76 provides an 800-MHz signal on line 22-800, and divide-by-two circuit 78 provides a 50-MHz signal on line 22-50.

Although the invention has been described with reference to a particular embodiment, it is to be understood that this embodiment is merely illustrative of the application of the principles of the invention. Numerous modifications may be made therein and other arrangements may devised without departing from the spirit and scope of the invention.

I claim:

1. A full-octave direct frequency synthesizer comprising means for generating a plurality of drive frequencies all of which are integral multiples of the lowest drive frequency; a plurality of sequentially connected stages; and means for coupling all of said drive frequencies to said stages; each of a sub-group of said sequentially connected stages operating on an input frequency derived from the preceding stage and generating an output frequency for the succeeding stage which is a function of the sum of one-tenth of the input frequency plus an added increment within at least a full-octave range; each of the stages in said sub-group including at least first and second serially-connected sections each including means selectively operable for mixing an input frequency and a drive frequency to form a respective group of frequencies, and a plurality of switchable filter means for selecting one of said respective group of frequencies; and means for selecting one of the respective frequencies of the last serially-connected section for the succeeding stage.

2. A full-octave direct frequency synthesizer in accordance with claim 1 wherein the first section of each stage includes a mixer sub-stage for mixing the input frequency and the highest drive frequency to convert the input frequency upward, and the second section of each stage includes an additional mixer sub-stage for selectively forming one of a respective group of frequencies by selectively leaving the converted input frequency unchanged, or adding to or subtracting from the converted input frequency one of the two lowest drive frequencies.

3. A full-octave direct frequency synthesizer in accordance with claim 1 wherein the last section of at least some of said stages includes divide-by-ten means selectively operable for dividing the frequency extended from the preceding section to the output of the last section.

4. A full-octave direct frequency synthesizer in accordance with claim 1 wherein said drive frequencies are in the ratios 1:2:16, and the first stage uses the lowest drive frequency as its input frequency.

* * * * *